(12) United States Patent
Nakajima

(10) Patent No.: US 7,675,089 B2
(45) Date of Patent: Mar. 9, 2010

(54) SEMICONDUCTOR DEVICE

(75) Inventor: Sakae Nakajima, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 246 days.

(21) Appl. No.: 11/806,232

(22) Filed: May 30, 2007

(65) Prior Publication Data
US 2007/0278522 A1 Dec. 6, 2007

(30) Foreign Application Priority Data
Jun. 2, 2006 (JP) ............................. 2006-154313

(51) Int. Cl.
*H01L 29/737* (2006.01)
(52) U.S. Cl. .................. 257/192; 257/241; 257/249; 257/E27.014
(58) Field of Classification Search .................. 257/401, 257/241, 249, 192
See application file for complete search history.

(56) References Cited

U.S. PATENT DOCUMENTS 4,546,453 A * 10/1985 Noufer ........................ 365/104
2006/0267110 A1* 11/2006 Chen .......................... 257/401

FOREIGN PATENT DOCUMENTS

| JP | 62-81054 | 4/1987 |
|----|----------|--------|
| JP | 2-210864 | 8/1990 |
| JP | 6-13574 | 1/1994 |

* cited by examiner

*Primary Examiner*—Jerome Jackson, Jr.
*Assistant Examiner*—Dale Page
(74) *Attorney, Agent, or Firm*—McGinn IP Law Group PLLC

(57) ABSTRACT

In relation to the conventional semiconductor device provided with a plurality of FETs, there is room for improving the pair accuracy of the FET-pair. A semiconductor device includes a first FET, a second FET, a third FET and a fourth FET. The four FETs are provided in an active region (certain region). The four have each of gate electrodes, respectively. Each of the gate electrodes are arranged along a circle in this sequence in plan view. The four FETs have the substantially same geometry.

19 Claims, 18 Drawing Sheets

PRIOR ART

PRIOR ART

SEMICONDUCTOR DEVICE

This application is based on Japanese patent application No. 2006-154313, the content of which is incorporated hereinto by reference.

BACKGROUND

1. Technical Field

The present invention relates to a semiconductor device.

2. Related Art

In relation to semiconductor devices having a plurality of field effect transistors (FETs), higher pair accuracy or namely higher relativity accuracy is often required between those FETs. For example, in relation to an operational amplifier or a differential circuit in comparator, or a pair FETs constituting a mirror circuit, high pair accuracy is required for reducing an input off-set voltage for such operational amplifier or such comparator.

Typical conventional semiconductor devices provided with a plurality of FETs include semiconductor devices described in Japanese Patent Laid-Open No. S62-81054 (No. 1987-81054) and Japanese Patent Laid-Open No. H06-13574 (No. 1994-13574).

FIG. 16 is a plan view, showing a semiconductor device described in Japanese Patent Laid-Open No. S62-81054. A semiconductor device 100 includes four FETs 101, 102, 103 and 104. Each of these FETs has an annular gate electrode 111, and a source electrode 112 and a drain region 113 provided in the outside and the inside thereof, respectively. In the FET 101 and the FET 103, the source electrode, the gate electrode and the drain electrode are electrically coupled with each other. A coupling situation between the FET 102 and the FET 104 is similar to that between the FET 101 and the FET 103.

Therefore, in the semiconductor device 100, a combination of the FET 101 and the FET 103 substantially functions as one FET and a combination of the FET 102 and the FET 104 substantially functions as another FET. Then, the FET composed of the FETs 101 and 103 and the FET composed of the FETs 102 and 104 constitute an FET pair.

FIG. 17 is a plan view, showing a semiconductor device described in Japanese Patent Laid-Open No. H06-13574. In a semiconductor device 200, an FET 210a and an FET 210b constituting an FET pair are also provided. The FETs 210a and 210b share a source region 201. The FET 210a has a gate electrode 202a and a drain region 203a. Similarly, the FET 210b has a gate electrode 202b and a drain region 203b.

In addition to above, another prior art document related to the present invention is Japanese Patent Laid-Open No. H02-210864 (1990), in addition to Japanese Patent Laid-Open No. S62-81054 and Japanese Patent Laid-Open No. H06-13574.

In the semiconductor device 100 of FIG. 16, the FETs 101, 102, 103 and 104 are disposed to be spaced apart from each other. In such configuration, the pair accuracies of the FET-pairs composed of such FETs are more easily affected by a variation of impurity concentration in the diffusion layer in the substrate surface, as compared with the configuration, in which these are disposed closely with each other.

Besides, in the semiconductor device 200 of FIG. 17, geometries of the respective gate electrodes 202a and 202b are equivalent to a partial rectangular (more specifically, three in four sides that constitutes a rectangle). Therefore, channel-length in corners of the gate electrode 202a and 202b (for example, a section surrounded with dotted line L1) is different from that of other sections. Since an electric current flowing through the source and the drain tends to flow through a pass of shorter channel-length as possible, a deviation is created in such electric current. This cause being susceptive with an influence of a variation of an impurity concentration in the diffusion layer in the substrate surface, leading to a decrease in the pair accuracy of the FET-pair.

As described above, in relation to the conventional semiconductor device provided with a plurality of FETs, there is room for improving the pair accuracy of the FET-pair.

SUMMARY

According to one aspect of the present invention, there is provided a semiconductor device comprising: a plurality of field effect transistors provided in a certain region defined by an element isolation region, wherein gate electrodes of the plurality of field effect transistors are arranged along a circle in plan view, and wherein at least two field effect transistors selected from the plurality of field effect transistors have substantially same geometry.

In such semiconductor device, a plurality of FETs are provided in a certain region. Thus, these FETs are more easily arranged to be closer to each other, as compared with a case of providing the FETs in different certain regions, respectively. Therefore, the pair accuracy of the FET-pair composed of these FETs is difficult to be influenced by a variation of an impurity concentration in the diffusion layer in the substrate surface. Further, the gate electrodes of the FETs are arranged along a circle. Thus, unlikely with the semiconductor device shown in FIG. 17, a deviation in an electric current flowing through the source and the drain can be prevented.

According to the present invention, a semiconductor device having a constitution that is suitable in improving a pair accuracy of an FET-pair is achieved.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Exemplary implementations of semiconductor devices according to the present invention will be described in reference to the annexed figures. In all figures, identical numeral is assigned to an element commonly appeared in the description of the present invention in reference to the figures, and the detailed description thereof will not be repeated.

FIRST EMBODIMENT

Figure 1:
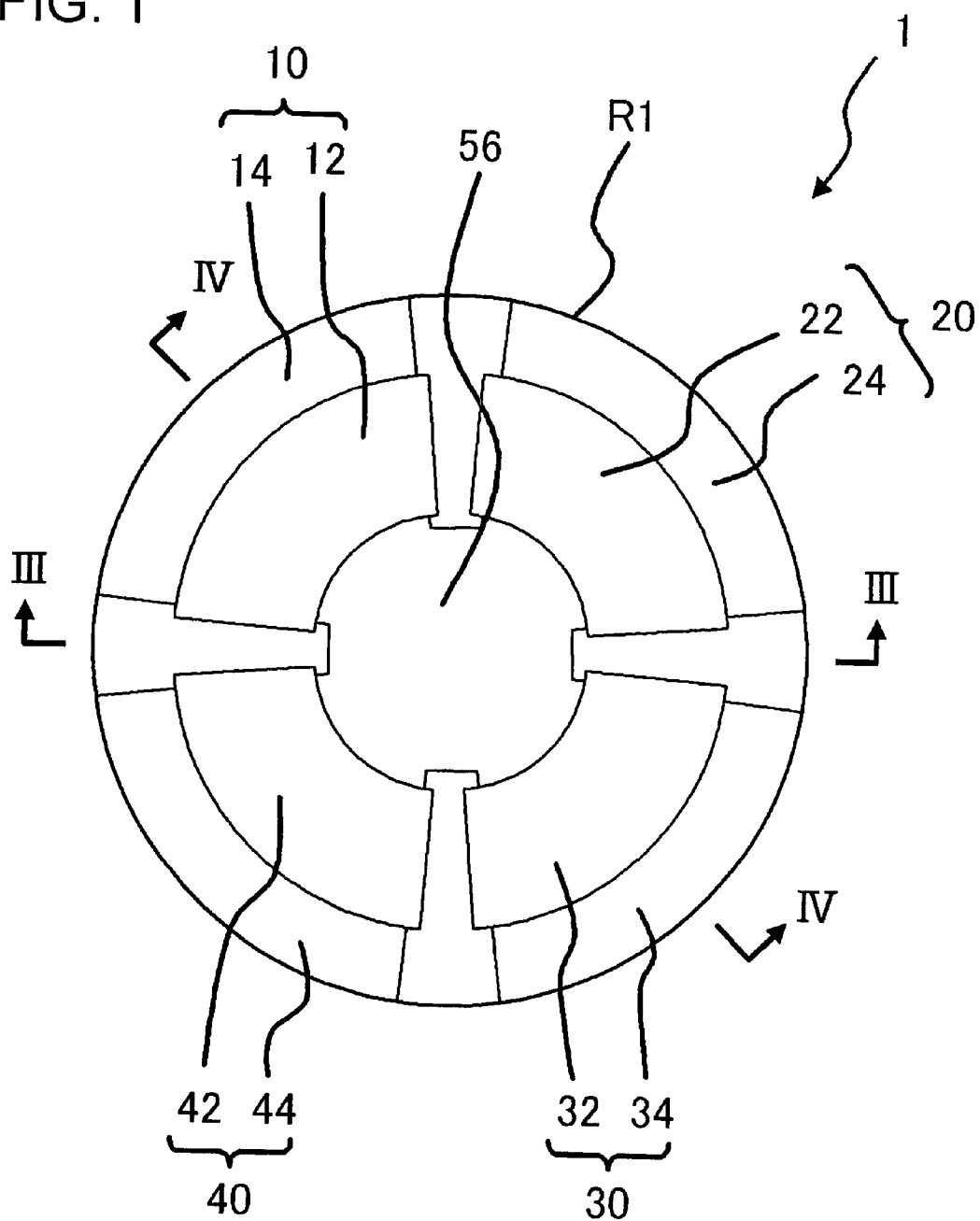
FIG. 1 is a plan view, illustrating first embodiment of a semiconductor device according to the present invention.

FIG. 1 is a plan view, showing first embodiment of a semiconductor device according to the present invention. A semiconductor device 1 includes an FET 10 (first FET), an FET 20 (second FET), an FET 30 (third FET) and an FET 40 (fourth FET). These FETs 10, 20, 30 and 40 are provided in an active region R1 (certain region). Here, the active region means a region defined by an element isolation region, as described above. More specifically, the active region R1 is surrounded by an element isolation region (not shown in FIG. 1). In addition, no element isolation region is present in the active region R1.

The FET 10, the FET 20, the FET 30 and the FET 40 have a gate electrode 12, a gate electrode 22, a gate electrode 32 and a gate electrode 42, respectively. The gate electrode 12, the gate electrode 22, the gate electrode 32 and the gate electrode 42 are arranged along a circle in this sequence in plan view. Materials of the gate electrodes 12, 22, 32 and 42 are, for example, polysilicon.

Figure 2:
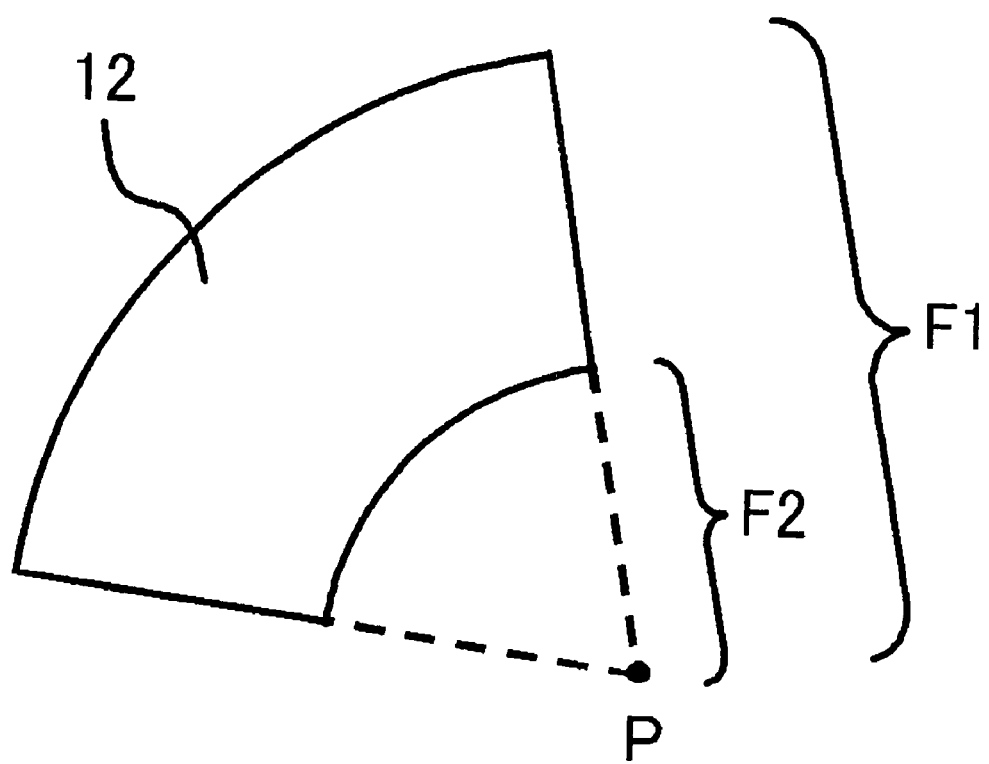
FIG. 2 is a plan view, useful in describing a two-dimensional geometry of a gate electrode in the semiconductor device of FIG. 1.

Besides, the FETs 10, 20, 30 and 40 have a substantially identical geometry. Therefore, the gate electrodes 12, 22, 32 and 42 also have a substantially identical geometry. Here, the term "to have a substantially identical geometry" means that geometries thereof in plan view are geometrically congruence. More specifically, as shown in FIG. 2, each of the gate electrodes 12, 22, 32 and 42 has a geometry that is substantially equivalent to a partial annular circle, which is prepared by eliminating a second sector F2 from a first sector F1 in plan view, the first sector F1 having a center P, which is equivalent to a center of the aforementioned circle, and the second sector having the center P, which is also equivalent to the center of the aforementioned circle, and having a radius, which is shorter than a radius of the first sector F1. In FIG. 2, the exemplary implementation is made in reference to the gate electrode 12.

Returning to FIG. 1, the outside of the above-described circle in plan view, or in other words, the outside of the gate electrode 12, 22, 32 and 42 are provided with diffusion layers 14, 24, 34 and 44 (first diffusion layer). The diffusion layer 14 with the gate electrode 12 and the diffusion layer 56 as discuss later, constitute the FET 10. The diffusion layer 24 with the gate electrode 22 and the diffusion layer 56, constitute the FET 20. The diffusion layer 34 with the gate electrode 32 and the diffusion layer 56, constitute the FET 30. Further, the diffusion layer 44 with the gate electrode 42 and the diffusion layer 56, constitute the FET 40. The diffusion layers 14, 24, 34 and 44 function as drain regions of the FETs 10, 20, 30 and 40, respectively.

The inside of the above-described circle in plan view is, or in other words, the insides of the gate electrodes 12, 22, 32 and 42 are, provided with the diffusion layer 56 (second diffusion layer). The diffusion layer 56 is shared by the FETs 10, 20, 30 and 40. The diffusion layer 56 functions as source regions of the FETs 10, 20, 30 and 40.

In the configuration according to the present embodiment, the source region (diffusion layer 56), the gate electrode 32 and the drain region (diffusion layer 34) of the FET 30 are electrically coupled to the source region (diffusion layer 56), the gate electrode 12 and the drain region (diffusion layer 14) of the FET 10, respectively. Similarly, the source region (diffusion layer 56), the gate electrode 42 and the drain region (diffusion layer 44) of the FET 40 are electrically coupled to the source region (diffusion layer 56), the gate electrode 22 and the drain region (diffusion layer 24) of the FET 20, respectively.

Therefore, in the semiconductor device 1, one combination of the FET 10 and the FET 30 substantially function as an FET, and another combination of the FET 20 and the FET 40 substantially function as another FET. Thus, an FET pair is constituted of the FET, which is composed of the FETs 10 and 30, and the FET, which is composed of from FET 20 and 40.

Figure 3A:
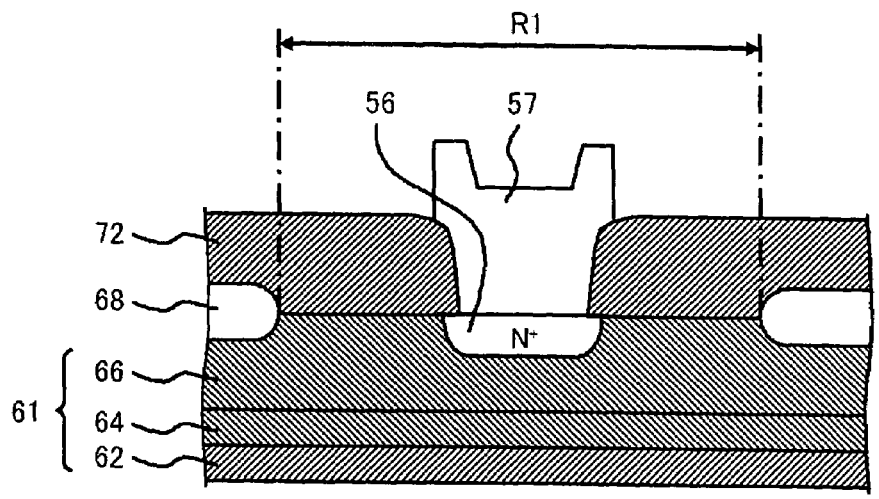
FIGS. 3A and 3B are cross-sectional views, illustrating a cross section along line III-III of the semiconductor device shown in FIG. 1.
Figure 3B:
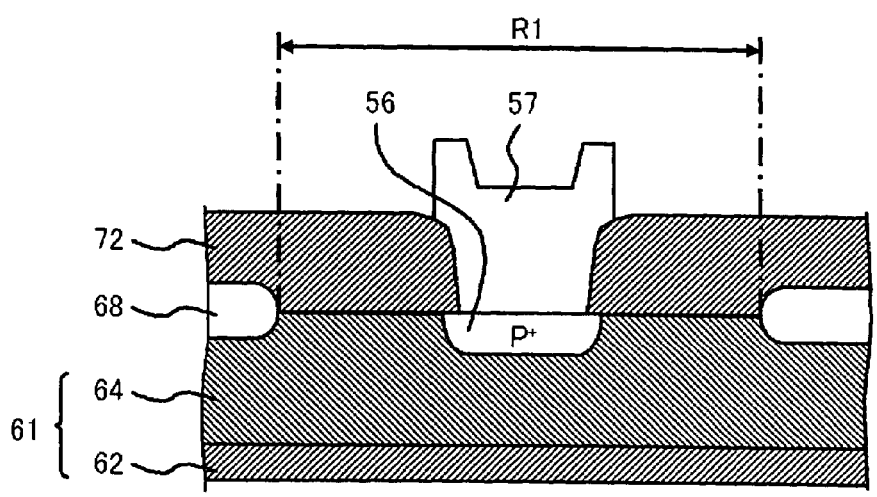
Figure 4A:
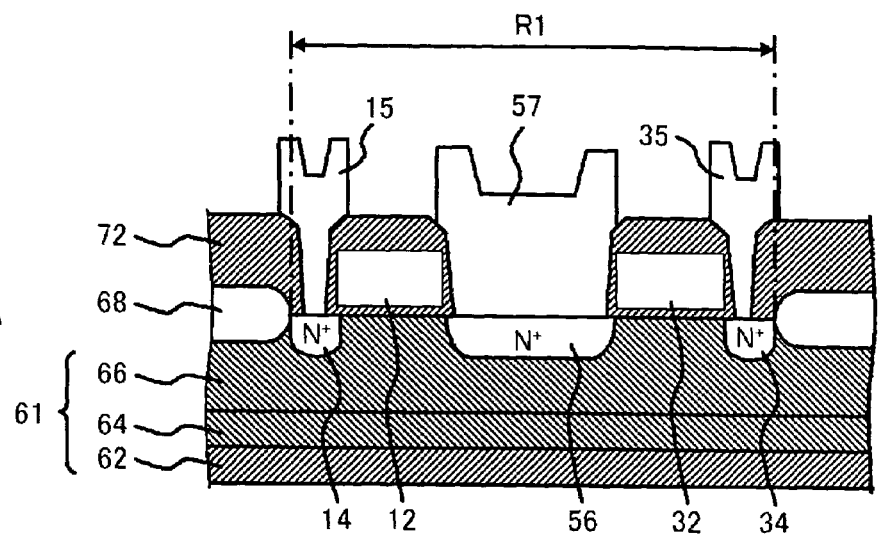
FIGS. 4A and 4B are cross-sectional view, illustrating cross section along line IV-IV of the semiconductor device shown in FIG. 1.
Figure 4B:
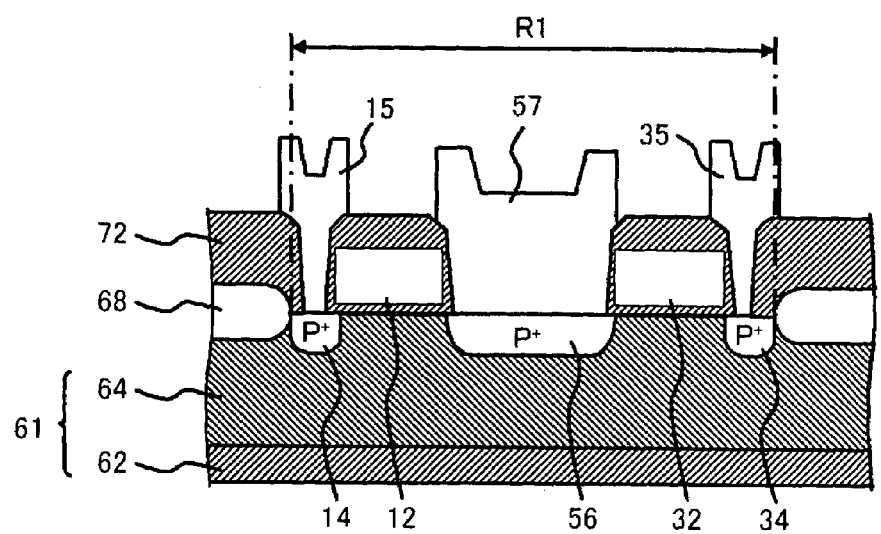

FIG. 3A and FIG. 3B are cross-sectional views, showing cross sections along line III-III of the semiconductor device 1 of FIG. 1. FIG. 4A and FIG. 4B are cross-sectional views, showing cross sections along line IV-IV of the semiconductor device 1 of FIG. 1. In these cross-sections, FIG. 3A and FIG. 4A represent N-channel FETs 10, 20, 30 and 40, and FIG. 3B and FIG. 4B represent P-channel FETs 10, 20, 30 and 40.

As can be seen from these cross-sectional views, the above-described gate electrodes 12, 22, 32 and 42 are formed on a semiconductor substrate 61. On the other hand, the diffusion layers 14, 24, 34 and 44 and the diffusion layer 56 are formed in the semiconductor substrate 61. The diffusion layers 14, 24, 34 and 44 and the diffusion layer 56 are N+ type when the FETs 10, 20, 30 and 40 are N-channel type FETs, and are P+ type when the FETs 10, 20, 30 and 40 are P-channel type FETs.

The semiconductor substrate 61 includes an N-type substrate 62 and an N-type epitaxial layer 64 formed thereon. However, it is not essential to provide the epitaxial layer 64 in the semiconductor substrate 61. When the FET 10, 20, 30, 40 are N-channel FET, a P-type well region 66 is further formed in a surface layer of the semiconductor substrate 61. Further, the semiconductor substrate 61 is provided with an element isolation region 68 formed therein. Typical configuration of the element isolation region 68 includes shallow trench isolation (STI) or local oxidation of silicon (LOCOS).

An interlayer insulating film 72 is also provided on the semiconductor substrate 61. Further, the source electrode 57 is coupled to the diffusion layer 56 via an opening formed in the interlayer insulating film 72, and, the drain electrode 15 and the drain electrode 35 are coupled to the diffusion layer 14 and the diffusion layer 34, respectively. In addition to above, the diffusion layers 24 and 44, which do not appear in the cross-sectional view of FIG. 4A or FIG. 4B, are coupled to the drain electrodes, similarly as the diffusion layer 14 and 34. Further, the interlayer insulating film 72, the source electrode 57 and the drain electrode 15 and 35 are not shown in the plan view of FIG. 1.

Figure 5:
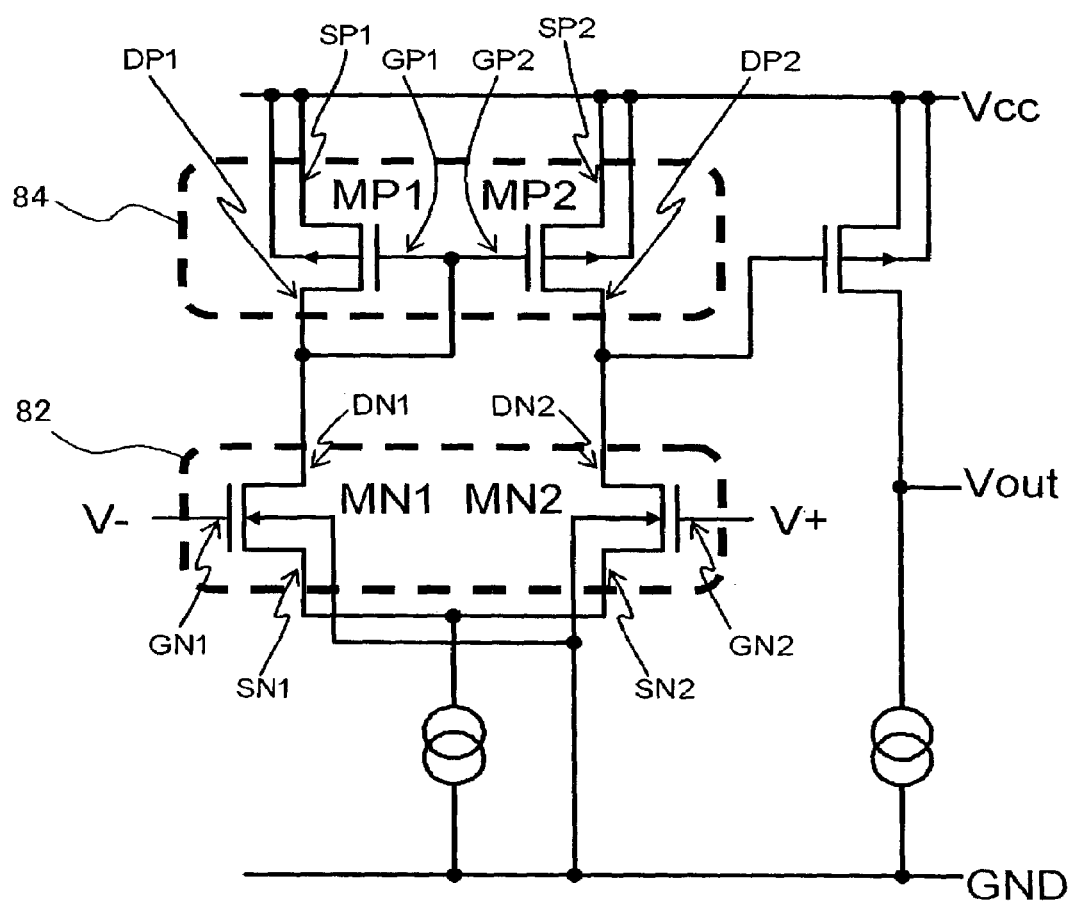
FIG. 5 is a circuit architecture diagram, illustrating a configuration of a general comparator.
Figure 6:
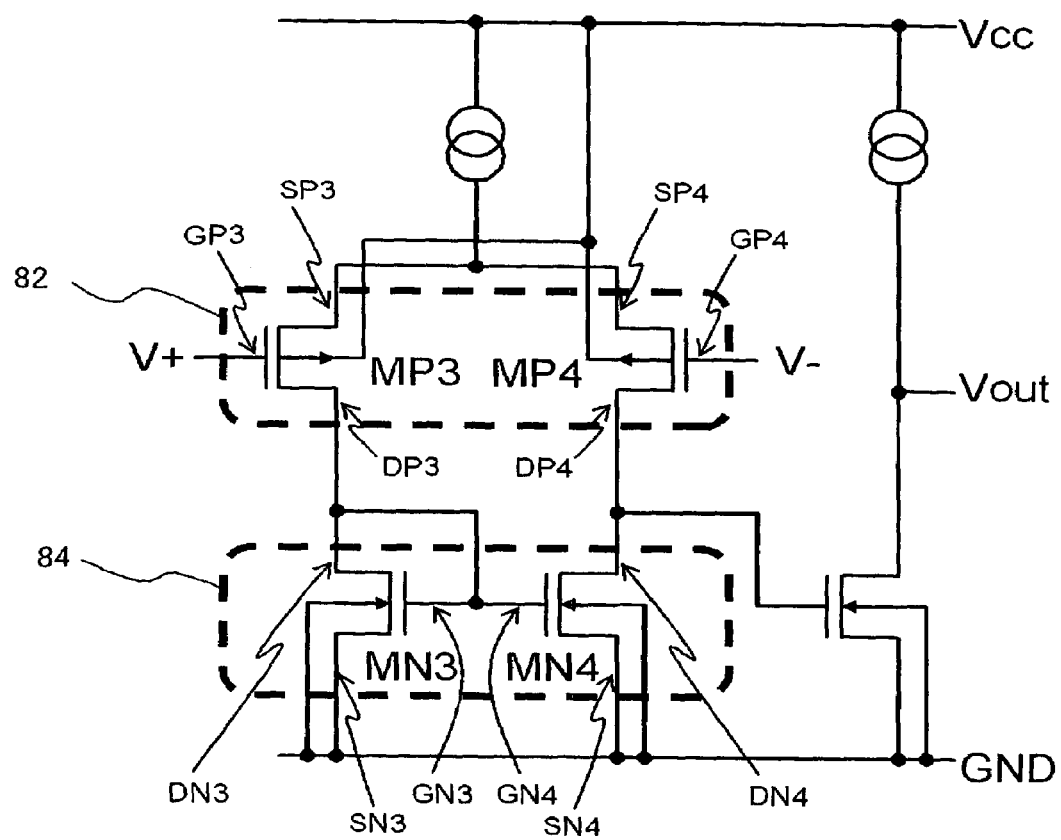
FIG. 6 is also a circuit architecture diagram, illustrating a configuration of a general comparator.

Suitable applications of the present invention will be described in reference to FIG. 5 and FIG. 6. FIG. 5 and FIG. 6 are circuit architecture diagrams, showing a general comparator. A comparator presented in these diagrams includes a differential circuit 82 and a mirror circuit 84. The differential circuit 82 is constituted of an FET pair, which is composed of two N-channel FETs (MN1 and MN2) in the exemplary implementation shown in FIG. 5, and is alternatively constituted of an FET pair, which is composed of two P-channel FETs (MP3 and MP4) in the exemplary implementation shown in FIG. 6. Besides, the mirror circuit 84 is constituted of an FET pair, which is composed of two P-channel FETs (MP1 and MP2) in the exemplary implementation shown in FIG. 5, and is alternatively constituted of an FET pair, which is composed of two N-channel FETs (MN3 and MN4) in the exemplary implementation shown in FIG. 6. In FIG. 5, sources of FETs (MP1, MP2, MN1 and MN2) are represented by SP1, SP2, SN1 and SN2, gates of FETs (MP1, MP2, MN1 and MN2) are represented by GP1, GP2, GN1 and GN2, and drains of FETs (MP1, MP2, MN1 and MN2) are represented by DP1, DP2, DN1 and DN2, respectively. In FIG. 6, sources of FETs (MP3, MP4, MN3 and MN4) are represented by SP3, SP4, SN3 and SN4, gates of FETs (MP3, MP4, MN3 and MN4) are represented by GP3, GP4, GN3 and GN4, and drains of FETs (MP3, MP4, MN3 and MN4) are represented by DP3, DP4, DN3 and DN4, respectively.

The present invention may be preferably applied to the comparator having such configuration. For example, taking the differential circuit 82 as an example, the FET composed of the FETs 20 and 40 may be employed for the MN1 (or MP3), and the FET composed of the FETs 10 and 30 may be employed for the MN2 (or MP4). Similar configuration may be applied to the mirror circuit 84, and specifically, the FET composed of the FETs 10 and 30 may be employed for the MP1 (or MN3), and the FET composed of the FETs 20 and 40 may be employed for the MP2 (or MN4).

Figure 7:
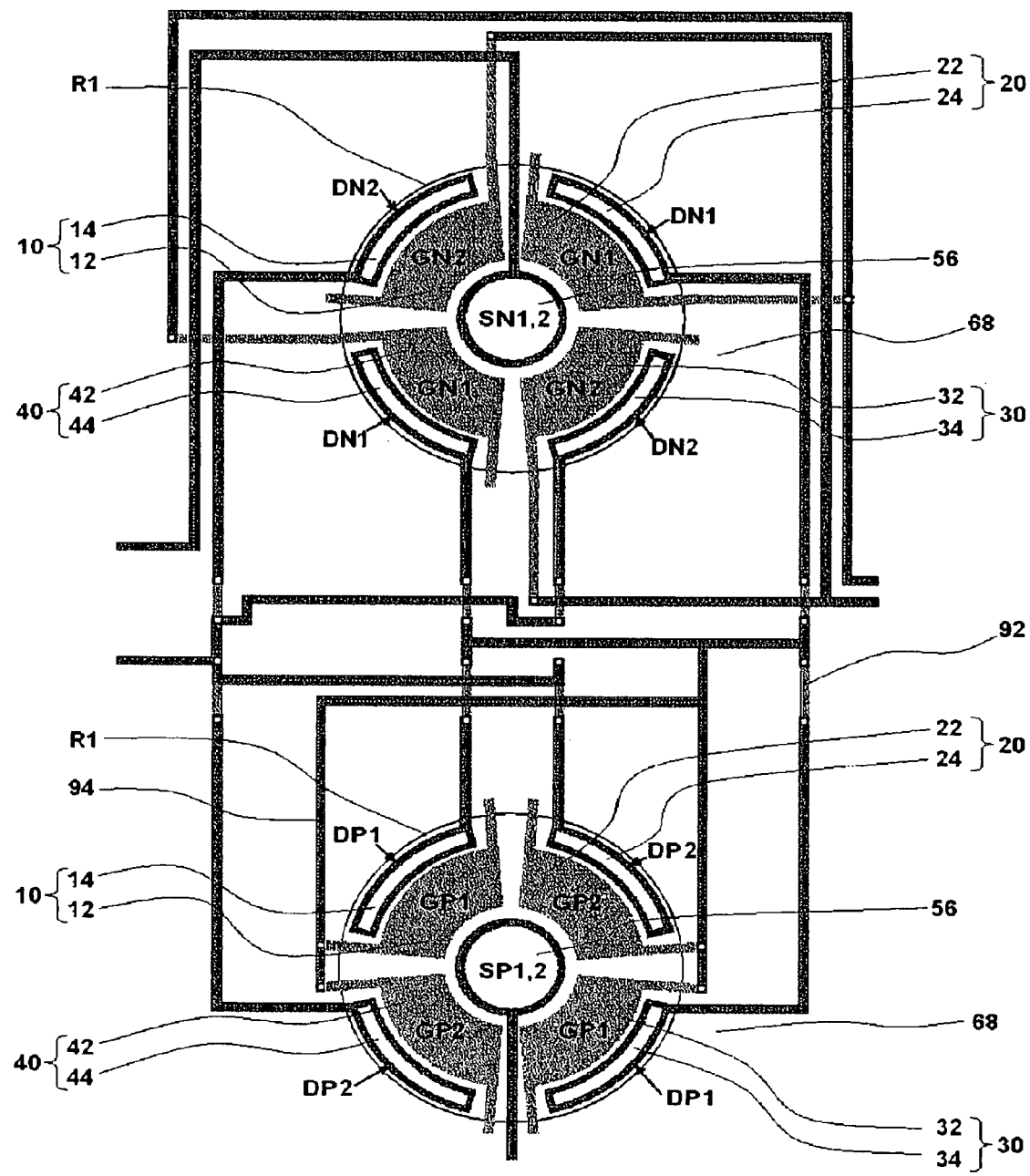
FIG. 7 a plan view, illustrating an example of a circuit layout, in which the present invention is applied to the comparator shown in FIG. 5.

FIG. 7 is a plan view, showing an example of a circuit layout in a case of applying the present invention to the comparator of FIG. 5. In this exemplary implementation, a differential circuit (differential circuit 82 of FIG. 5) is disposed in an active region R1 in an upper section of the diagram, and a mirror circuit (mirror circuit 84 of FIG. 5) is disposed in an active region R1 in a lower section of the diagram. Concerning the differential circuit, the FETs 10 and 30 correspond to the MN2 of FIG. 5, and the FETs 20 and 40 correspond to the MN1. On the other hand, concerning the mirror circuit, the FETs 10 and 30 correspond to the MP1 of FIG. 5, and the FETs 20 and 40 correspond to the MP2. Further, in the mirror circuit, the respective gate electrodes of the FETs (MP1 and MP2) are mutually coupled via a metallic interconnect 94. Here, a numeral 92 in FIG. 7 represents a polysilicon.

Advantageous effects obtainable by employing the configuration of the present embodiment will be described. In FIG. 5, an improved pair accuracy of the FET pair (NM1 and MN2) of the differential circuit 82 allows a reduced input off-set voltage of the comparator. Further, an improved pair accuracy of the FET pair (NP1 and MP2) of the mirror circuit 84 allows a reduced input off-set voltage of the comparator. In the semiconductor device 1, as described in reference to FIG. 7, the FETs 10, 20, 30 and 40 are provided in one active region R1. Thus, more closer arrangement of these FETs can be achieved, as compared with a case of providing these FETs in different active regions. Therefore, the pair accuracy of the FET pair composed of these FETs is difficult to be influenced by a variation of an impurity concentration in the diffusion layer in the substrate surface.

Figure 17:
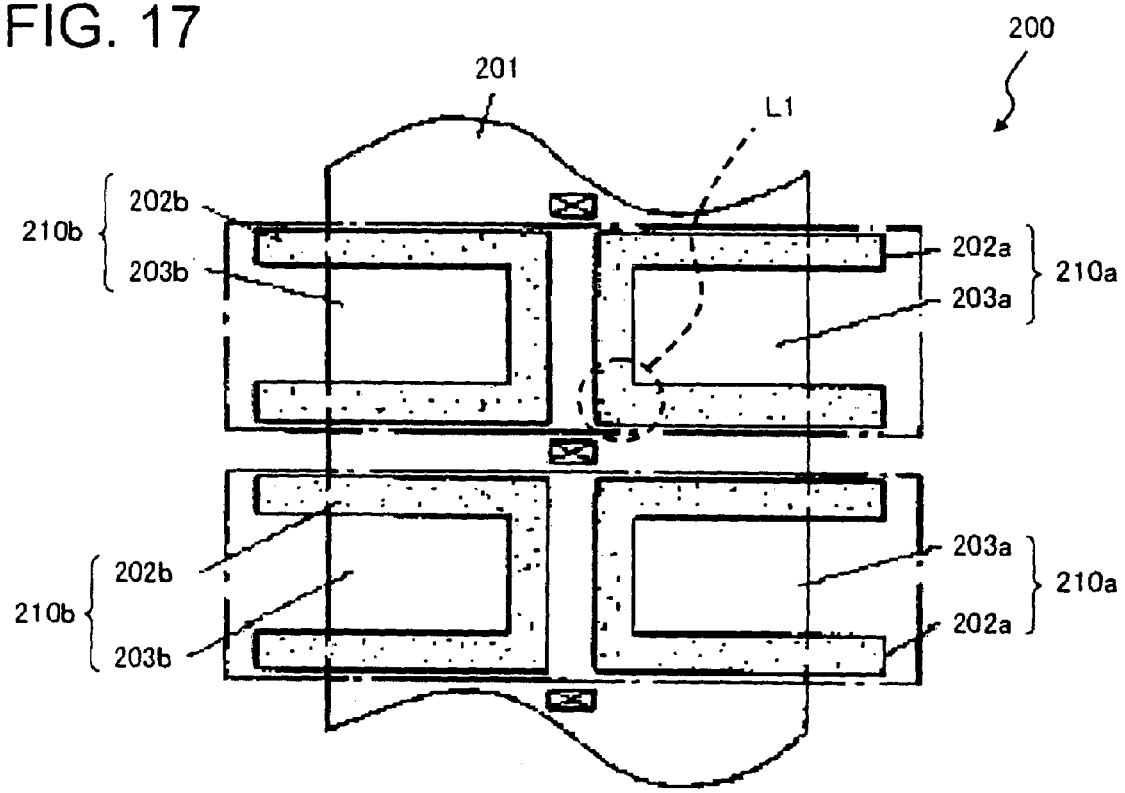
FIG. 17 is a plan view, illustrating a semiconductor device described in Japanese Patent Laid-Open No. H06-13574.

Further, the gate electrodes 12, 22, 32 and 42 of the FETs are arranged along one circle. Therefore, unlike as a case of the semiconductor device shown in FIG. 17, no corner of the gate electrode is present on the channel-forming region. Thus, the channel-lengths of respective FETs 10, 20, 30 and 40 are substantially constant, thereby preventing an electric current flowing through the source and the drain from being unevenly distributed. Therefore, the semiconductor device 1 having the structure suitable in improving the pair accuracy of the FET pair can be achieved.

Figure 16:
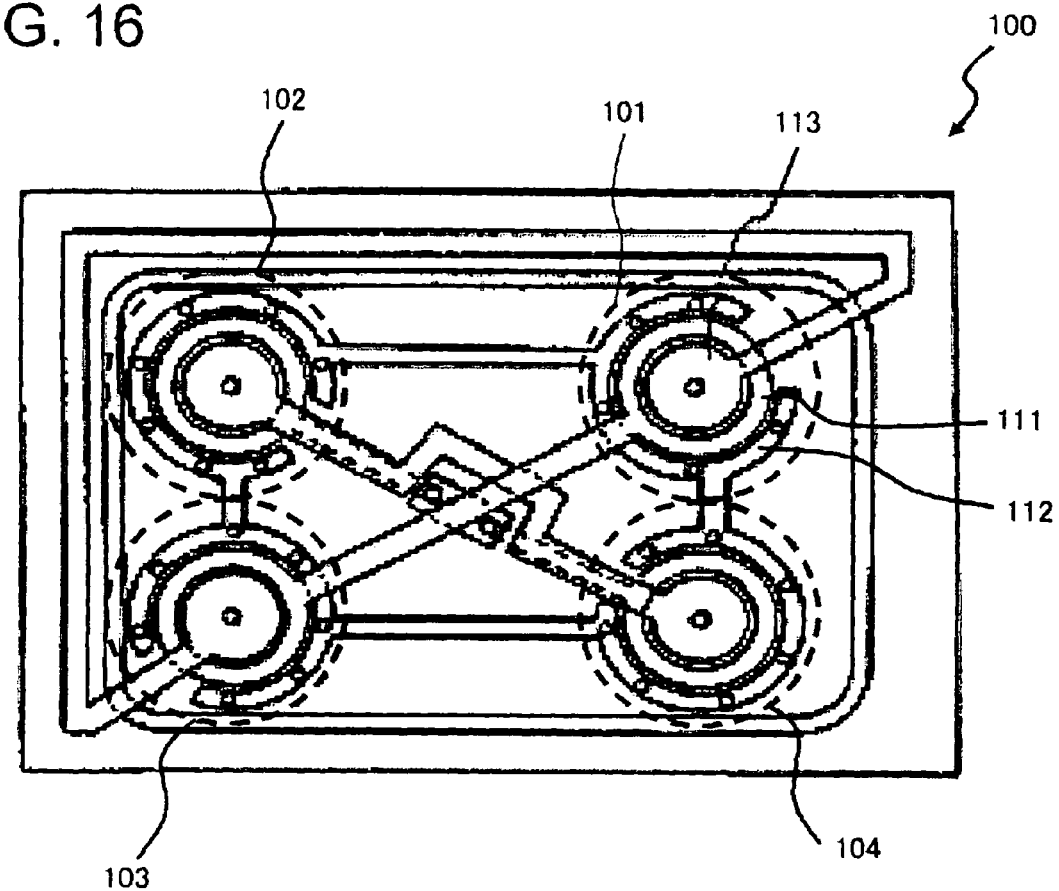
FIG. 16 is a plan view, illustrating a semiconductor device described in Japanese Patent Laid-Open No. S62-81054.

Since the FETs 10, 20, 30 and 40 are provided in the same active region R1, an area occupied by these FETs can be reduced. This eventually contributes to a miniaturization of the semiconductor device 1. On the contrary, when a plurality of FETs are provided in separate active regions as shown by the semiconductor device in FIG. 16, an area occupied by these FETs is increased.

In reference to FIG. 7, for example, the pair accuracy of the FET pair can be provided if the FETs 10 and 20 have substantially an identical geometry and the FETs 30 and 40 have substantially an identical geometry which is different from the identical geometry of the FETs 10 and 20. This allows an improved pair accuracy of the FET pair constituted of the FETs 10 and 30 and the FETs 20 and 40. More specifically, the FETs 10, 20, 30 and 40 have substantially an identical geometry, which allows further improvement in the pair accuracy of the FET pair. On the contrary, the FET pair having different geometries are easily affected by a dimension difference, resulting in providing a structure that is not suited for providing an improved pair accuracy.

Figure 18:
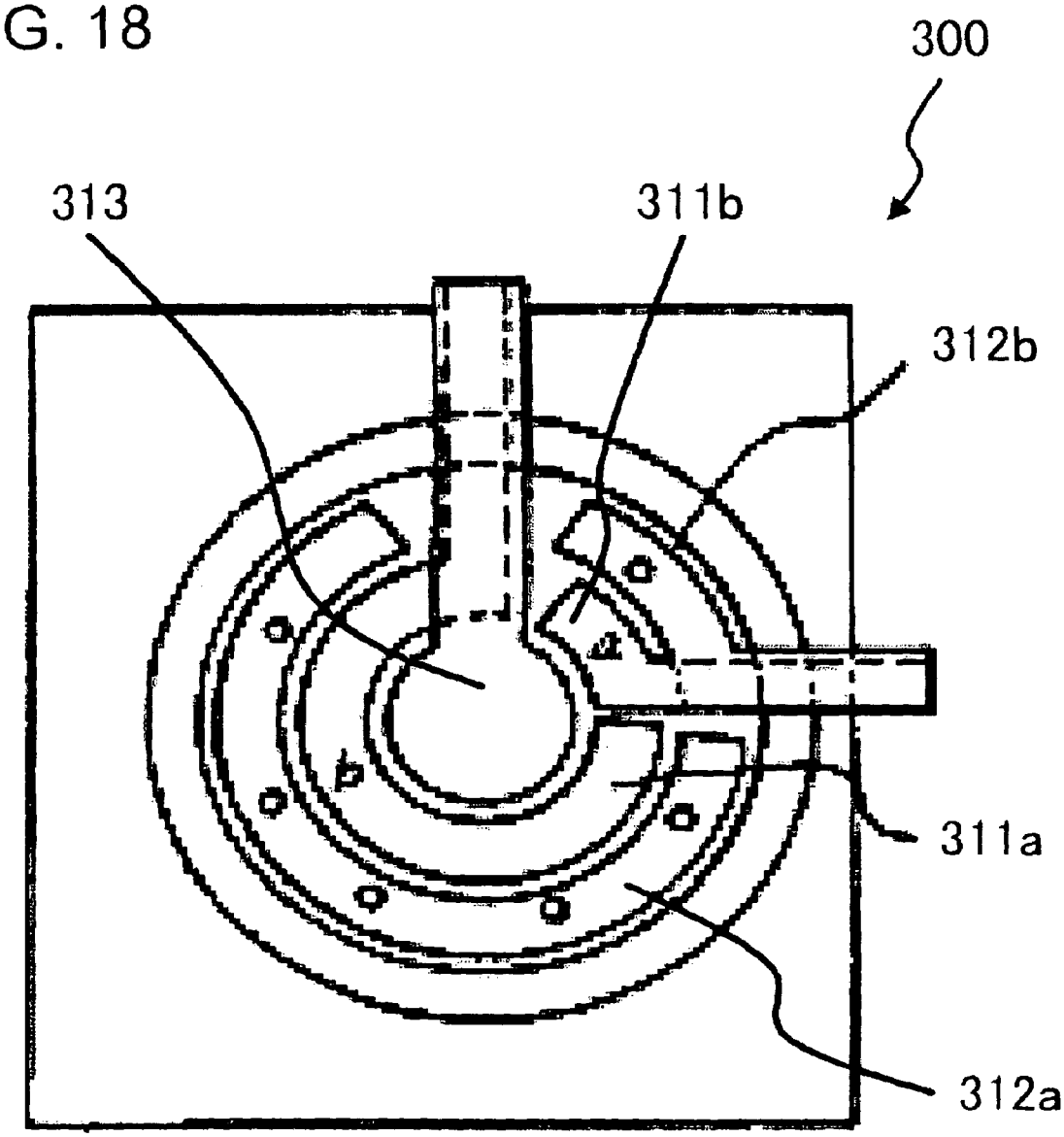
FIG. 18 is a plan view, illustrating another semiconductor devices described in Japanese Patent Laid-Open No. S62-81054.

FIG. 18 is a plan view, showing a conventional semiconductor device comprising a plurality of FETs having different geometries. The semiconductor device 300 is described in Japanese Patent Laid-Open No. S62-81054, similarly as the semiconductor device of FIG. 16. A gate electrode 311a and a gate electrode 311b are provided in the semiconductor device 300. The gate electrodes 311a and 311b have different geometries. The gate electrode 311a with the source electrode 312a, constitute an FET. Further, the gate electrode 311b, with the source electrode 312b, constitute another FET. These two FETs share a drain electrode 313. Since the semiconductor device 300 is easily affected by a dimension difference, resulting in a deteriorated dimensional accuracy, it is difficult to control an area ratio of the channel-forming regions of two FETs with higher accuracy.

In the semiconductor device 1, as described in reference to FIG. 2, the geometries of the respective gate electrodes 12, 22, 32 and 42 are substantially equivalent to a partial annular circle, which is prepared by eliminating a second sector F2 from a first sector F1. This allows easily achieving the FETs having a constant channel-length.

It is configured that a combination of the FET 10 and the FET 30 substantially function as an FET, and another combination of the FET 20 and the FET 40 substantially function as another FET. This allows that the pair accuracy of the FET pair composed of these FETs is further difficult to be influenced by a variation of an impurity concentration in the diffusion layer in the substrate surface. For example, when a single-dimensional concentration gradient is present, in which an impurity concentration is lower as closer to the right end in the diagram of FIG. 1, the diffusion layers of the FET 10 and the FET 40 have relatively higher concentrations, and the diffusion layers of the FET 20 and the FET 30 have relatively lower concentrations. Therefore, the above described configuration results in that both of the FET composed of the FETs 10 and 30 and the FET composed of the FETs 20 and 40 contain both of the diffusion layer of higher concentration and the diffusion layer of lower concentration. Therefore, in relation to the pair accuracy between these FETs, an influence of the above-described concentration gradient hardly appears.

The diffusion layer 56 is shared by the FETs 10, 20, 30 and 40. Thus, a plurality of FETs having the source regions that are mutually electrically coupled with a simple configuration can be obtained. Further, this preferably allows applying the semiconductor device 1 to circuits such as a differential circuit or a mirror circuit, employing the FET pair having source regions that are mutually coupled. In particular, as illustrated in FIG. 5 and FIG. 6, if the semiconductor device is applied to a differential circuit or a mirror circuit of a comparator, an input off-set voltage of the comparator can be reduced.

SECOND EMBODIMENT

Figure 8:
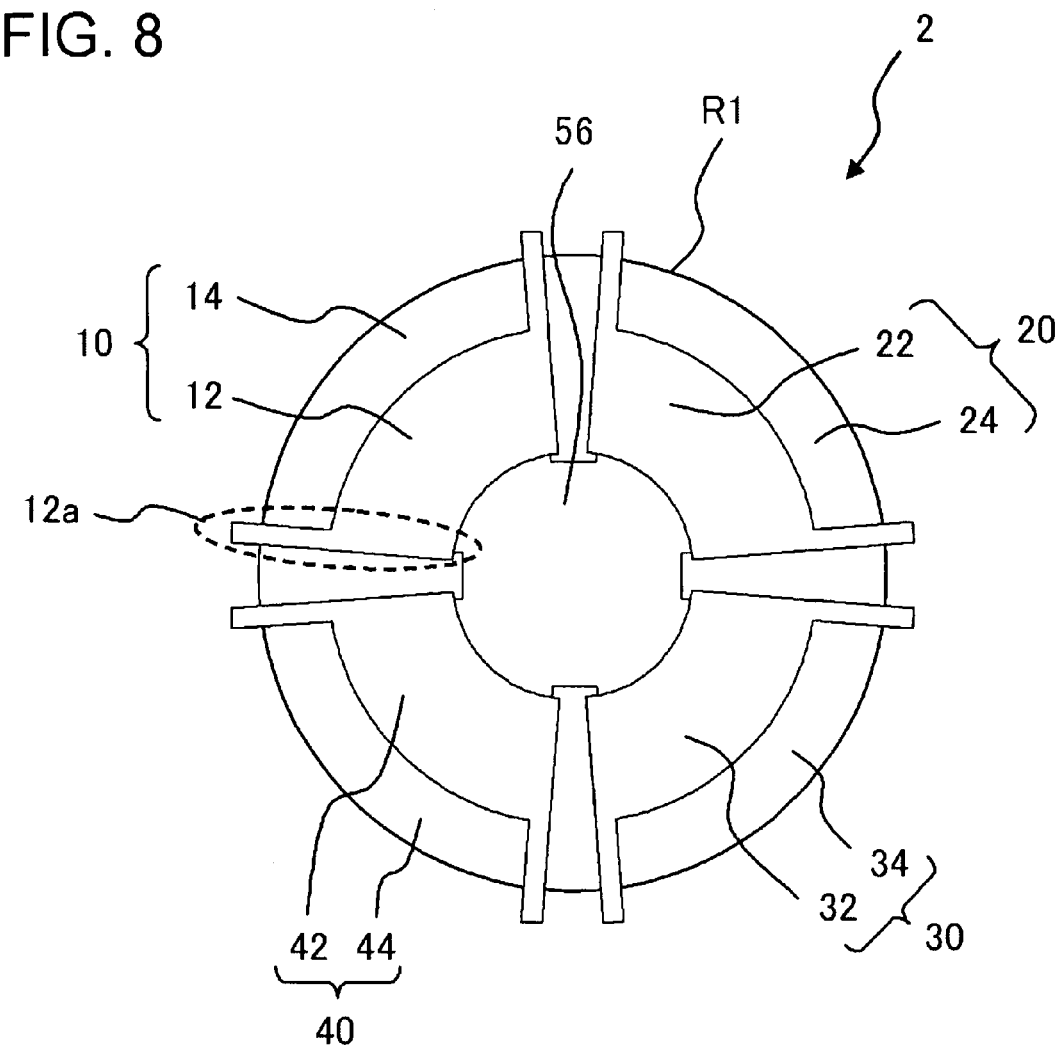
FIG. 8 is a plan view, illustrating second embodiment of a semiconductor device according to the present invention.

FIG. 8 is a plan view, showing second embodiment of a semiconductor device according to the present invention. In a semiconductor device 2, the configurations of the gate electrodes 12, 22, 32 and 42 are different from that of the semiconductor device 1 described in reference to FIG. 1. Other configurations of the semiconductor device 2 are similar to that of the semiconductor device 1.

In the semiconductor device 2, an end portion 12a of a gate electrode 12 protrudes toward the outside of the above-described circle. The protruded section defines an end portion of a diffusion layer 14. Such protruded section extends to the outside of an active region R1. This provides the diffusion layer 14 being completely surrounded by the gate electrode 12 and an element isolation region, in plan view. The configurations of the gate electrodes 22, 32 and 42 are also similar to the gate electrode 12.

Here, concerning dependencies for a dimensional accuracy of a channel-forming region, the semiconductor device 2 is compared with the semiconductor device 1. For simplicity, the exemplary implementation will be made in reference to the FET 10. In the semiconductor device 1, a dimensional accuracy of the channel-forming region depends upon three parameters, namely: a dimensional accuracy in the geometry of the gate electrode 12 (polysilicon, for example); a dimensional accuracy in the geometry of the diffusion layer 14; and a dimensional accuracy in the geometry of the diffusion layer 56. On the other hand, in the semiconductor device 2, a dimensional accuracy of the channel-forming region depends upon two parameters, namely: a dimensional accuracy in the geometry of the gate electrode 12; and a dimensional accuracy in the geometry of the diffusion layer 56. Therefore, according to the semiconductor device 2, more improved pair accuracy of the FET pair can be achieved, as compared with the semiconductor device 1. Other advantageous effects of the semiconductor device 2 are similar to that of the semiconductor device 1.

THIRD EMBODIMENT

Figure 9:
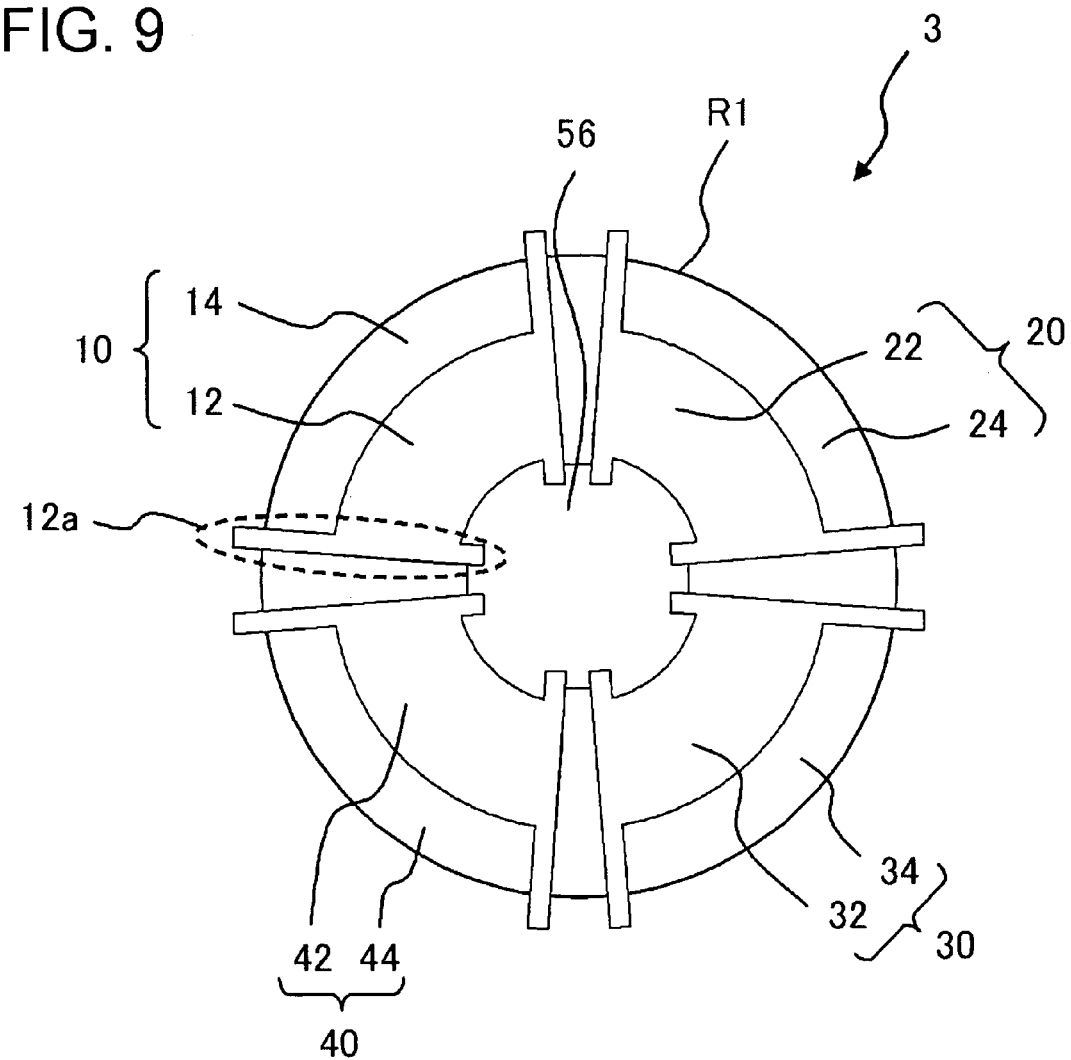
FIG. 9 is a plan view, illustrating third embodiment of a semiconductor device according to the present invention.

FIG. 9 is a plan view, showing third embodiment of a semiconductor device according to the present invention. In a semiconductor device 3, the configurations of the gate electrodes 12, 22, 32 and 42 are different from that of the semiconductor device 1 described in reference to FIG. 1. Other configurations of the semiconductor device 3 are similar to that of the semiconductor device 1.

In the semiconductor device 3, an end portion 12a of a gate electrode 12 protrudes toward both of the outside and the inside of the above-described circle. It is similar as described for the semiconductor device 2 in reference to FIG. 8 that the protruded section defines an end portion of a diffusion layer 14. In semiconductor device 3, the additional inwardly-protruded section defines an end portion of a section adjacent the gate electrode 12 in the diffusion layer 56. The configurations of the gate electrodes 22, 32 and 42 are similar to that of the gate electrode 12.

In the semiconductor device 3 having such configuration, a dimensional accuracy of the channel-forming region depends only a dimensional accuracy in the geometry of the gate electrode 12. Therefore, the semiconductor device 3 can provide more improved pair accuracy of the FET pair can be achieved, as compared with the semiconductor device 2. Other advantageous effects of the semiconductor device 3 are similar to that of the semiconductor device 2. In addition to above, in all of the semiconductor devices 1, 2 and 3, a dimensional accuracy of the channel-forming region does not depend on a dimensional accuracy of the active region R1. This is because the gate electrodes 12, 22, 32 and 42 are disposed within the active region R1.

In the present embodiment, the end portion 12a may be protruded only toward the inside of the above-described circle. In such case, a dimensional accuracy of the channel-forming region depends upon two parameters, namely: a dimensional accuracy in the geometry of the gate electrode 12; and a dimensional accuracy in the geometry of the diffusion layer 14. Therefore, such semiconductor device can provide more improved pair accuracy of the FET pair can be achieved, as compared with the semiconductor device 1.

It is not intended that the semiconductor device according to the present invention is limited to the configurations illustrated in the above-described embodiments, and thus various modifications thereof are also available. For example, in the above-described embodiments, exemplary implementations of the four FETs constituting FET pairs, which are divided by 2 FETs to 2 FETs, have been illustrated. More specifically, exemplary implementations of the FET pairs, which are constituted by the FET composed of two FETs 10 and 30 and the FET composed of two FETs 20 and 40, have been illustrated. Alternatively, two FETs constituting the FET pair may be divided by one FET to one FET, or six or more FETs constituting the FET pairs may be divided by three or more FETs to three or more FETs. An example of one-and-one is shown in FIG. 10, FIG. 11 and FIG. 12, and an example of four-and-four is shown in FIG. 13, FIG. 14 and FIG. 15.

Figure 10:
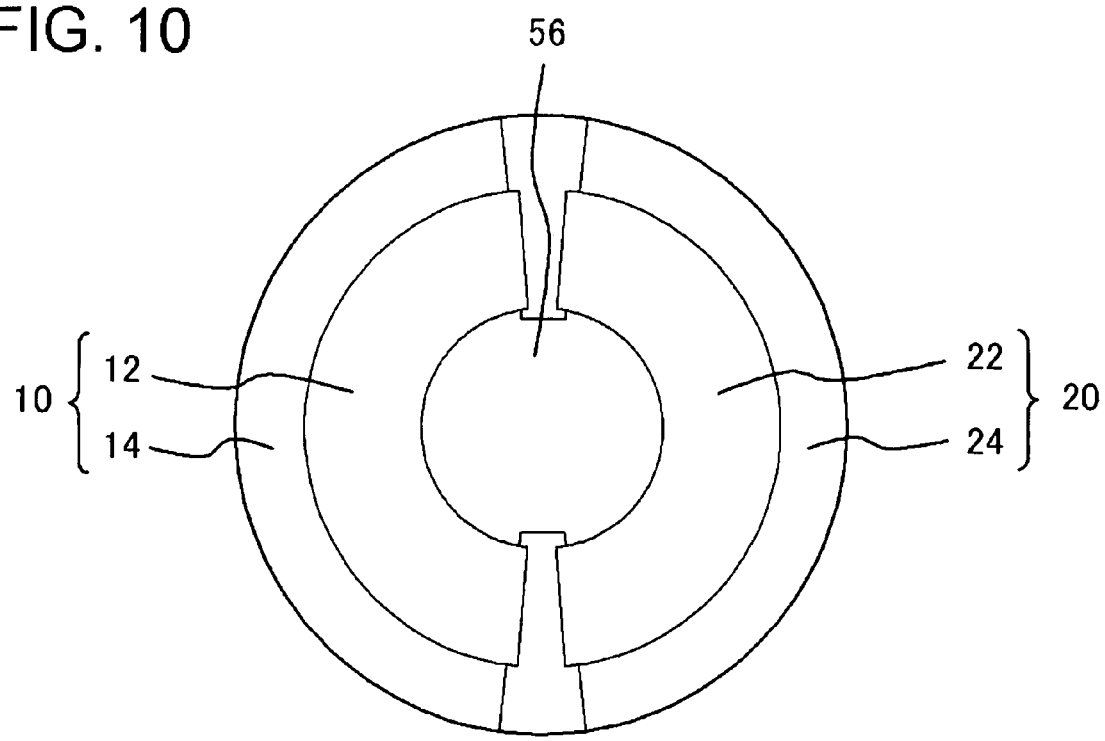
FIG. 10 is a plan view, illustrating a modified example in the preferred embodiments.
Figure 11:
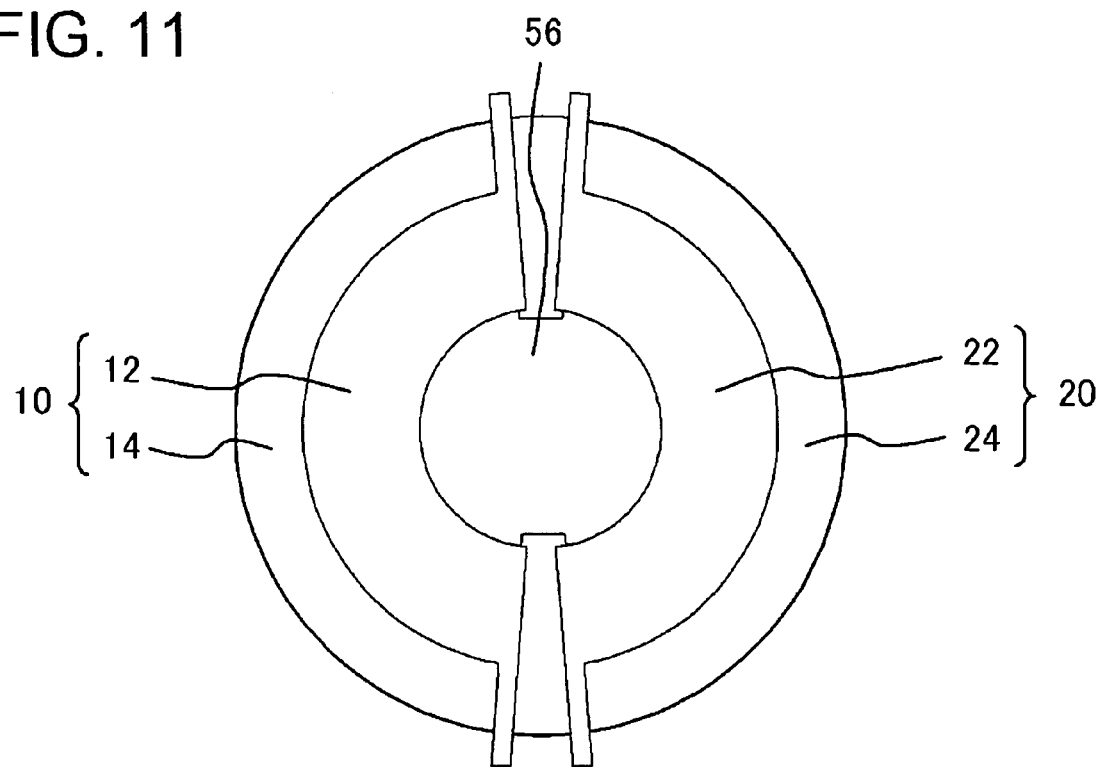
FIG. 11 is a plan view, illustrating another modified example in the preferred embodiments.
Figure 12:
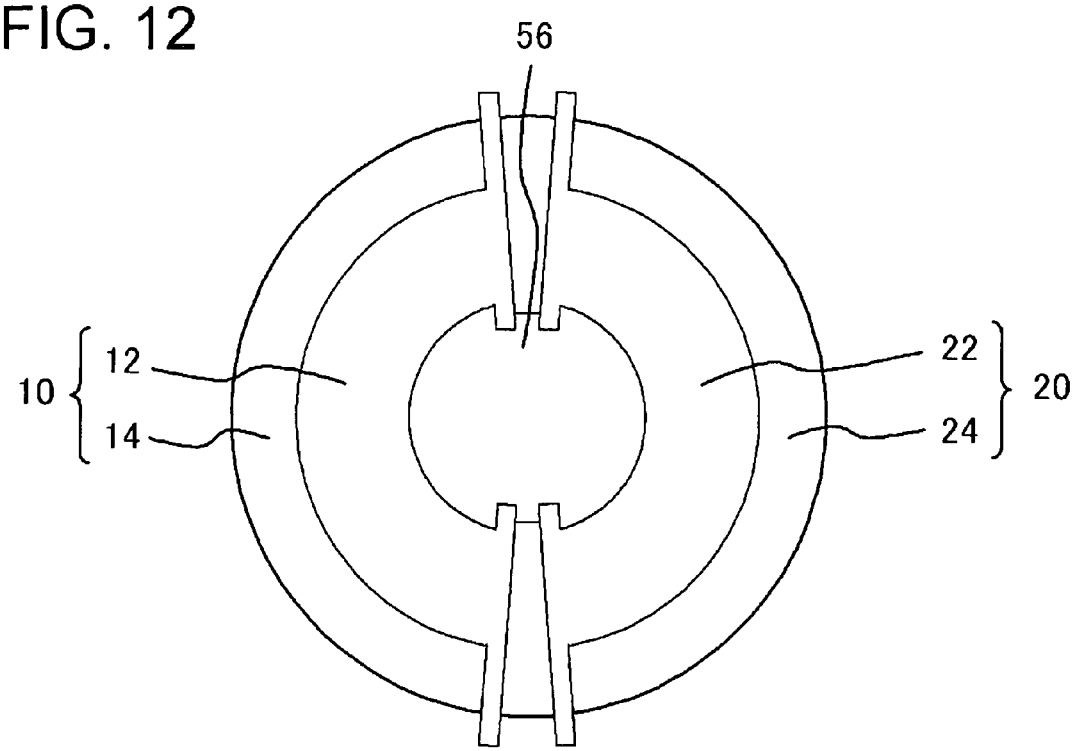
FIG. 12 is a plan view, illustrating further modified example in the preferred embodiments.

In FIG. 10, FIG. 11 and FIG. 12, two FETs composed of the FET 10 and the FET 20 are provided. The FET 10 and the FET 20 constitute a FET pair. In these diagrams, FIG. 11 illustrates an example of the end portion of the gate electrode being protruded toward the outside of the circle, similarly as in FIG. 8. Further, FIG. 12 illustrates an example of the end portion of the gate electrode being protruded toward both of the outside and the inside of a circle, similarly as in FIG. 9.

Figure 13:
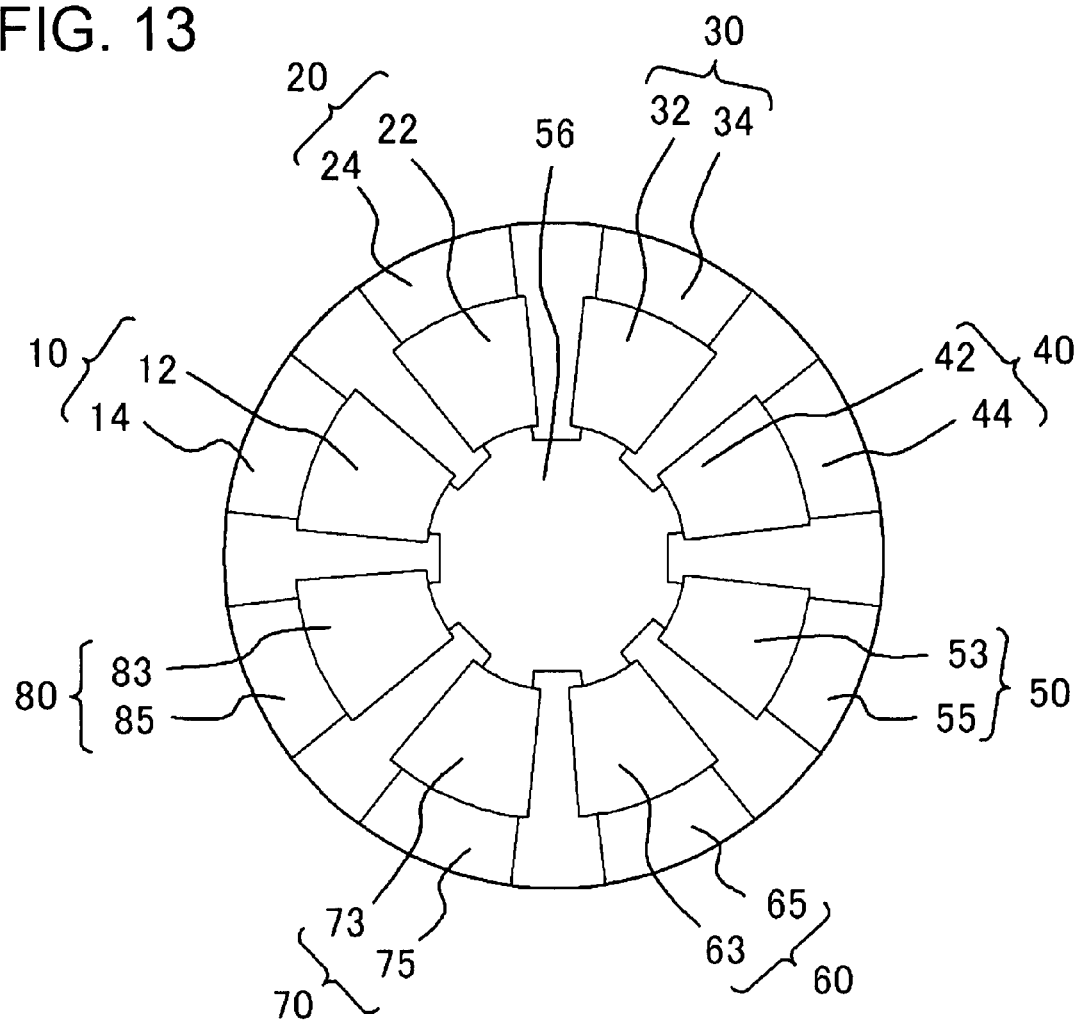
FIG. 13 is a plan view, illustrating yet other modified example in the preferred embodiments.
Figure 14:
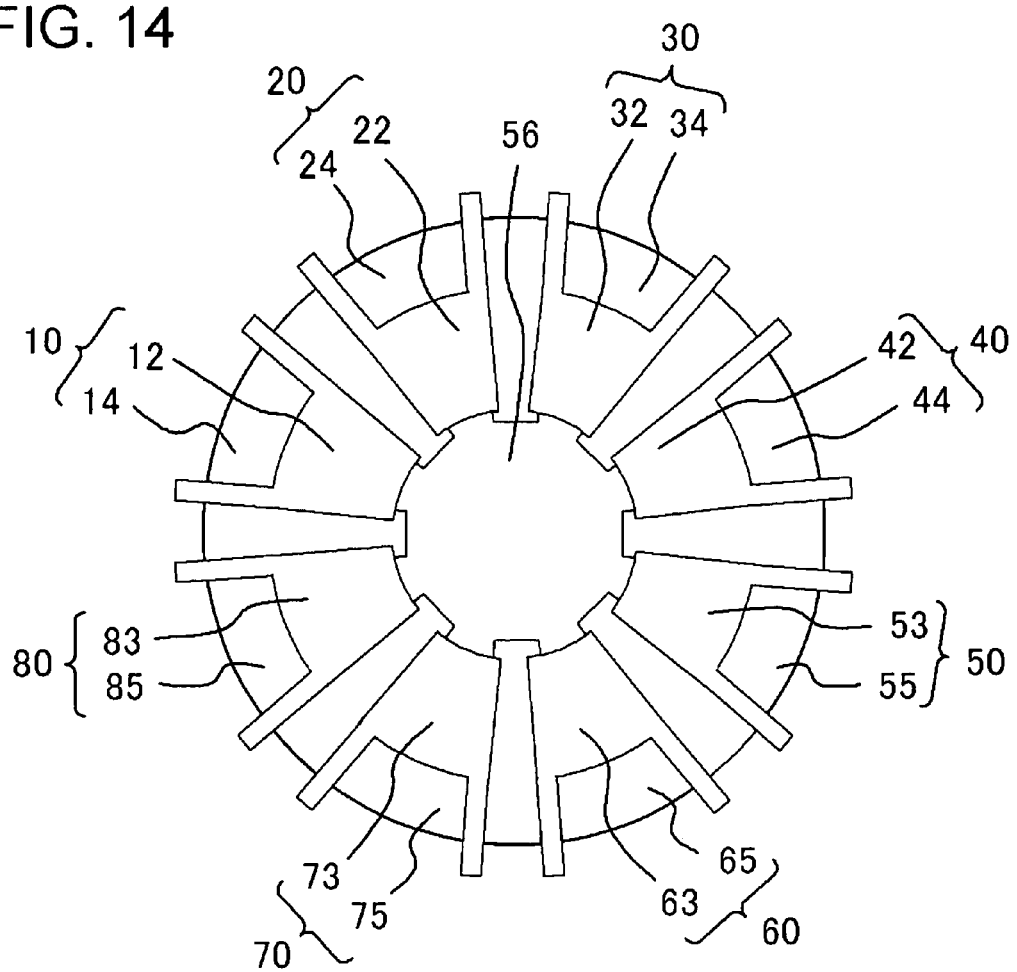
FIG. 14 is a plan view, illustrating yet other modified example in the preferred embodiments.
Figure 15:
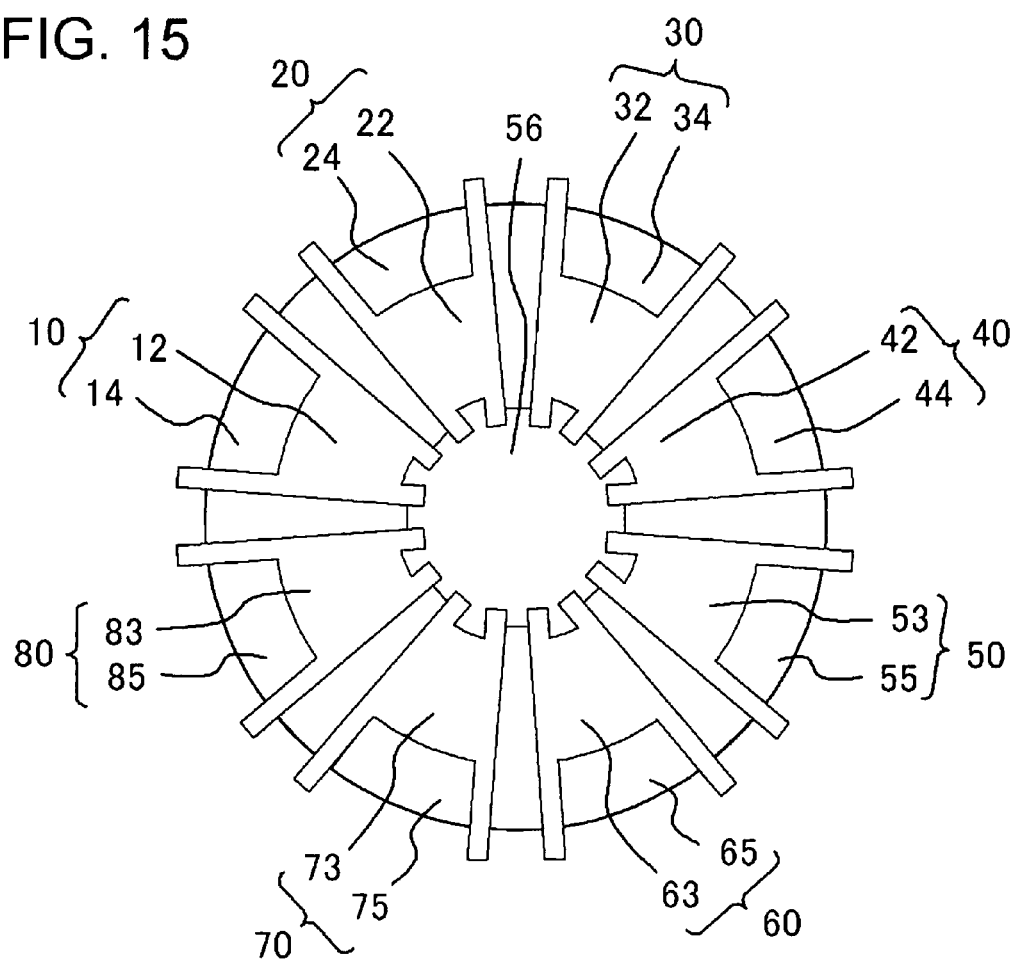
FIG. 15 is a plan view, illustrating yet other modified example in the preferred embodiments.

In FIG. 13, FIG. 14 and FIG. 15, eight FETs 10, 20, 30, 40, 50, 60, 70 and 80 are provided. The FETs 50, 60, 70 and 80 have gate electrodes 53, 63, 73 and 83, respectively. Further, the FETs 50, 60, 70 and 80 have diffusion layers 55, 65, 75 and 85 functioning as drain regions, respectively. In each of the FETs 10, 30, 50 and 70, electrical couplings are formed among the source region, the gate electrode and the drain region. Similarly, in each of the FETs 20, 40, 60 and 80, electrical couplings are formed among the source region, the gate electrode and the drain region. Having such configuration, an FET pair is constituted by an FET composed of the FETs 10, 30, 50 and 70 and an FET composed of the FETs 20, 40, 60 and 80. In these diagrams, FIG. 14 illustrates an example of the end portion of the gate electrode being protruded toward the outside of the circle, similarly as in FIG. 8. Further, FIG. 15 illustrates an example of the end portion of the gate electrode being protruded toward both of the outside and the inside of a circle, similarly as in FIG. 9.

Further, in the above-described embodiments, in the above-described embodiment, exemplary implementations of two FETs among the FETs 10, 20, 30 and 40 substantially functioning as one FET, and the rest two of these FETs substantially functioning as another FET, have been illustrated. Alternatively, Each of the FETs 10, 20, 30 and 40 may alternatively functions as an independent FET. In the case, for example, two FET pairs composed of the FET pair constituted by the FETs 10 and 20 and the FET pair constituted by the FETs 30 and 40 can be formed in an active region.

In the above-described embodiments, exemplary implementations of the gate electrodes 12, 22, 32 and 42 being arranged along a circumference of a complete circle have been illustrated. Alternatively, the gate electrodes 12, 22, 32 and 42 may alternatively be arranged along a circumference of a polygon that is similar to a circle, instead of the circumference of the complete circle. Even in such case, it can also be considered that the gate electrodes 12, 22, 32 and 42 are arranged along a circle.

In the above-described embodiments, exemplary implementations of all FETs in the active region R1 having the same geometry, have been illustrated. Alternatively, if three or more FETs are provided in the active region R1, it is sufficient that at least two FETs have the same geometry.

In the above-described embodiments, exemplary implementations of the diffusion layer (diffusion layer 56) in the inside of the gate electrode functioning as a source region have been illustrated. Alternatively, such diffusion layer may function as a drain region, and a diffusion layer outside of the gate electrode may function as a source region.

In the above-described embodiments, exemplary implementations of applying the present invention to a comparator have been illustrated. Alternatively, the present invention may also be preferably applied to an operational amplifier.

It is apparent that the present invention is not limited to the above embodiment, and may be modified and changed without departing from the scope and spirit of the invention.

What is claimed is:

1. A semiconductor device, comprising:
a plurality of field effect transistors (FETs) provided in a certain region defined by an element isolation region,
wherein gate electrodes of said plurality of field effect transistors are arranged along a circular path in a plan view,
wherein at least two field effect transistors selected from said plurality of field effect transistors have substantially a same geometry, and
wherein each of said gate electrodes has a geometry that is substantially equivalent to a partial annular circle, which is prepared by eliminating a second sector from a first sector in said plan view, said first sector having a center, which is equivalent to a center of said circle, and said second sector having a center, which is also equivalent to the center of said circle, and having a radius, which is shorter than a radius of said first sector.

2. The semiconductor device as set forth in claim 1, wherein said plurality of field effect transistors include a first, a second, a third and a fourth field effect transistors, and
wherein said gate electrodes of said first, said second, said third, and said fourth field effect transistors are arranged sequentially along said circle.

3. The semiconductor device as set forth in claim 2, wherein a source region, a gate electrode, and a drain region of said third field effect transistor are electrically coupled to a source region, a gate electrode, and a drain region of said first field effect transistor, respectively, and
wherein a source region, a gate electrode, and a drain region of said fourth field effect transistor are electrically coupled to a source region, a gate electrode, and a drain region of said second field effect transistor, respectively.

4. The semiconductor device as set forth in claim 1, further comprising a first diffusion layer and a second diffusion layer, each being provided in an outside and an inside of said circle in said plan view, respectively,
wherein one of said first and said second diffusion layers functions as a source region of said field effect transistor, and the other of said first and said second diffusion layers functions as a drain region of said field effect transistor.

5. The semiconductor device as set forth in claim 4, wherein an end portion of said gate electrode protrudes toward the outside of said circle, and
wherein an end of said first diffusion layer is defined by the protruded section.

6. The semiconductor device as set forth in claim 5, wherein an end portion of said gate electrode protrudes toward the inside of said circle, and
wherein an end of a portion of said second diffusion layer adjacent said gate electrode is defined by the protruded section.

7. The semiconductor device as set forth in claim 5, wherein said plurality of field effect transistors share said second diffusion layer.

8. The semiconductor device as set forth in claim 7, wherein said second diffusion layer functions as a source region of each of said field effect transistors.

9. The semiconductor device as set forth in claim 1, wherein said plurality of field effect transistors include a pair of field effect transistors, each of which has a source region, said source regions of said pair of field effect transistors being mutually electrically coupled.

10. The semiconductor device as set forth in claim 5, wherein said plurality of field effect transistors include a pair of field effect transistors, each of which has a source region, said source regions of said pair of field effect transistors being mutually electrically coupled.

11. The semiconductor device as set forth in claim 10, wherein said pair of field effect transistors comprise components of one of a differential circuit and a mirror circuit.

12. The semiconductor device as set forth in claim 10, wherein said pair of field effect transistors comprise one of a differential circuit and a mirror circuit in one of an operational amplifier and in a comparator.

13. A semiconductor device, comprising:
a first field effect transistor pair comprising a first field effect transistor and a second field effect transistor; and
a second field effect transistor pair comprising a third field effect transistor and a fourth field effect transistor,
wherein a gate electrode, a source region, and a drain region for each of the first and second field effect transistors are electrically connected, wherein a gate electrode, a source region, and a drain region for each of the third and fourth field effect transistors are electrically connected, and wherein the gate electrodes for each of the first, second, third, and fourth transistors are arranged along a circular path along an outer circumference of a central diffusion layer, wherein each gate electrode for each of the first, second, third, and fourth transistors have substantially similar geometry, said geometry comprising an annulus having an arc length of less than 90 degrees, said annulus having an outer diameter defined by a respective first diffusion layer and an inner diameter defined by a second diffusion layer.

14. The semiconductor device of claim 13, wherein the second diffusion layer functions as a source for each of the first, second, third, and fourth transistors.

15. The semiconductor device of claim 13, wherein the second diffusion layer functions contacts each of the first, second, third, and fourth transistors.

16. The semiconductor device of claim 13, wherein the first, second, third, and fourth transistors function as drain regions for the respective one of the first, second, third, and fourth transistors.

17. The semiconductor device of claim 16, wherein an active region comprising the first, second, third, and fourth transistors is surrounded by an element isolation region.

18. The semiconductor device of claim 13, further comprising a plurality of element isolation regions provided between each annular gate electrode.

19. The semiconductor device of claim 1, wherein an annular shape of each gate electrode comprises an arc length of less than 90 degrees.

* * * * *